United States Patent
Shiffer, II et al.

[19]

[11] Patent Number: 6,066,962
[45] Date of Patent: May 23, 2000

[54] DIGITAL INTEGRATED CIRCUIT BUFFER DIGITAL DEVICE AND METHOD FOR BUFFERING DATA

[75] Inventors: James D. Shiffer, II, Pleasanton; Jeffrey F. Wong, Fremont, both of Calif.

[73] Assignee: VLSI Technology, Inc., Sunnyvale, Calif.

[21] Appl. No.: 08/885,052

[22] Filed: Jun. 30, 1997

[51] Int. Cl.[7] .......................... H03K 17/16; H03K 19/175
[52] U.S. Cl. .................. 326/81; 326/81; 326/80; 326/83; 326/86; 326/87; 326/68; 326/31; 326/33
[58] Field of Search .................. 326/80, 81, 83, 326/86, 87, 68, 31, 33

[56] References Cited

U.S. PATENT DOCUMENTS

| | | | |
|---|---|---|---|
| 5,300,832 | 4/1994 | Rogers | 307/475 |
| 5,300,835 | 4/1994 | Assar et al. | 307/475 |
| 5,381,062 | 1/1995 | Morris | 326/68 |
| 5,410,267 | 4/1995 | Haycock et al. | 326/81 |
| 5,420,527 | 5/1995 | Naber | 326/32 |
| 5,424,659 | 6/1995 | Stephens et al. | 326/81 |
| 5,451,889 | 9/1995 | Heim et al. | 326/81 |
| 5,477,172 | 12/1995 | Schnizlein | 327/99 |
| 5,481,471 | 1/1996 | Naglestad et al. | 364/489 |
| 5,534,789 | 7/1996 | Ting | 326/21 |
| 5,572,146 | 11/1996 | Ahn et al. | 326/27 |
| 5,574,389 | 11/1996 | Chu | 326/81 |
| 5,604,457 | 2/1997 | Ting | 327/321 |
| 5,798,657 | 8/1998 | Nebel et al. | 326/81 |
| 5,808,480 | 9/1998 | Morris | 326/81 |

OTHER PUBLICATIONS

Mixing 3–V and 5–V ICs, John Williams, IEEE Spectrum, pp. 40–42, Mar. 1993.
A 3/5 V Compatible I/O Buffer, Marcel J. M. Pelgrom and E. Carel Dijkmans, IEEE Journal of Solid–State Circuits, vol. 30, No. 7, pp. 823–825, Jul. 1995.

*Primary Examiner*—Michael Tokar
*Assistant Examiner*—Vibol Tan
*Attorney, Agent, or Firm*—Wells, St. John, Roberts, Gregory & Matkin, P.S.

[57] ABSTRACT

The present invention provides digital integrated circuits, buffers, digital devices and methods for buffering data. One embodiment of the digital integrated circuit comprises: a data input configured to receive an input signal at a first voltage; a data output configured to output an output signal at a second voltage; a controller coupled with the data input and the controller being configured to generate an internal control signal and an external control signal responsive to the input signal; the controller having a first voltage regulator configured to maintain the external control signal above a threshold and a feedback voltage regulator configured to maintain the internal control signal above a threshold; and an output driver coupled with the data output and the controller, the output driver being configured to apply the output signal to the data output responsive to the external control signal.

70 Claims, 4 Drawing Sheets

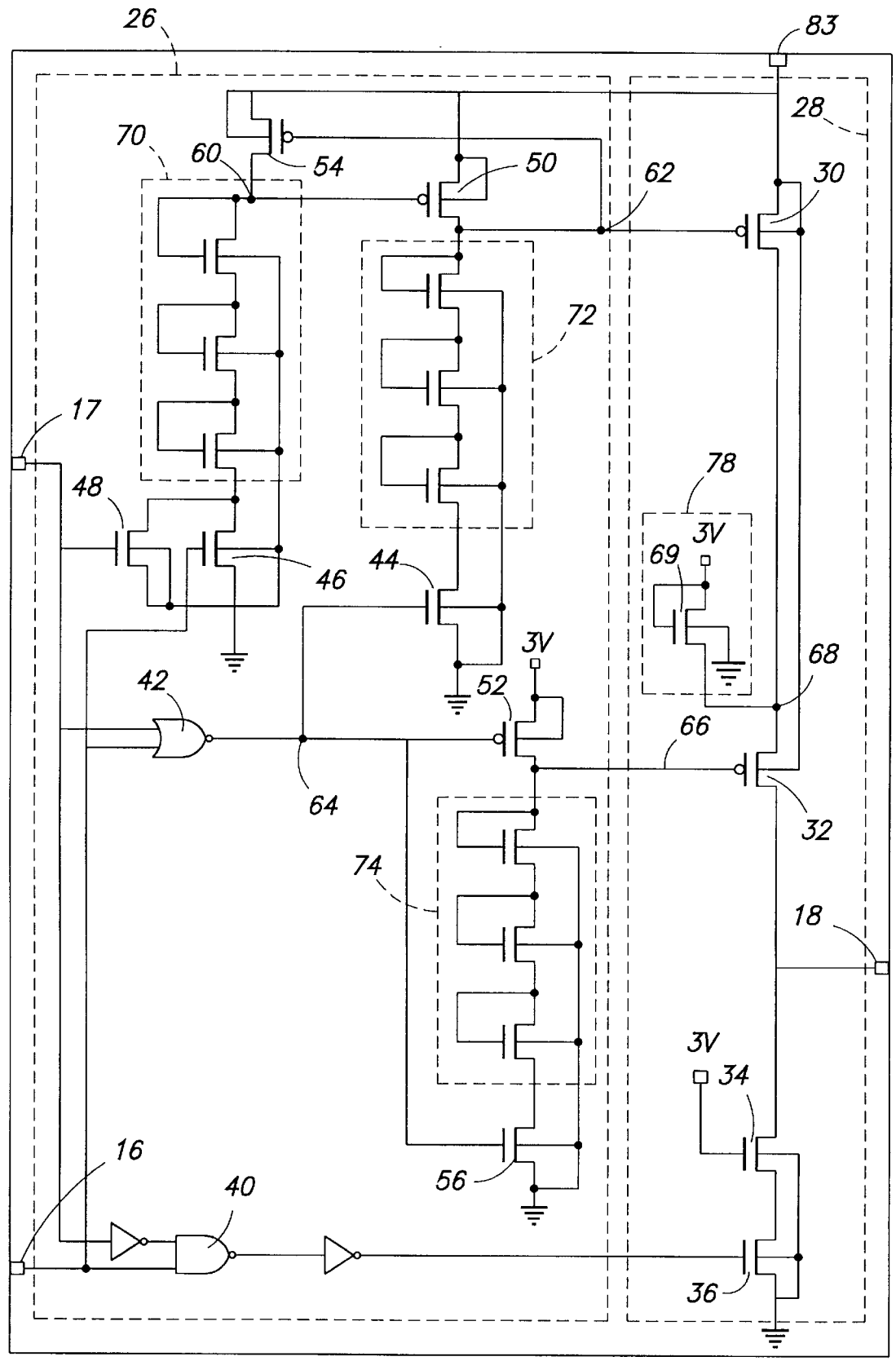

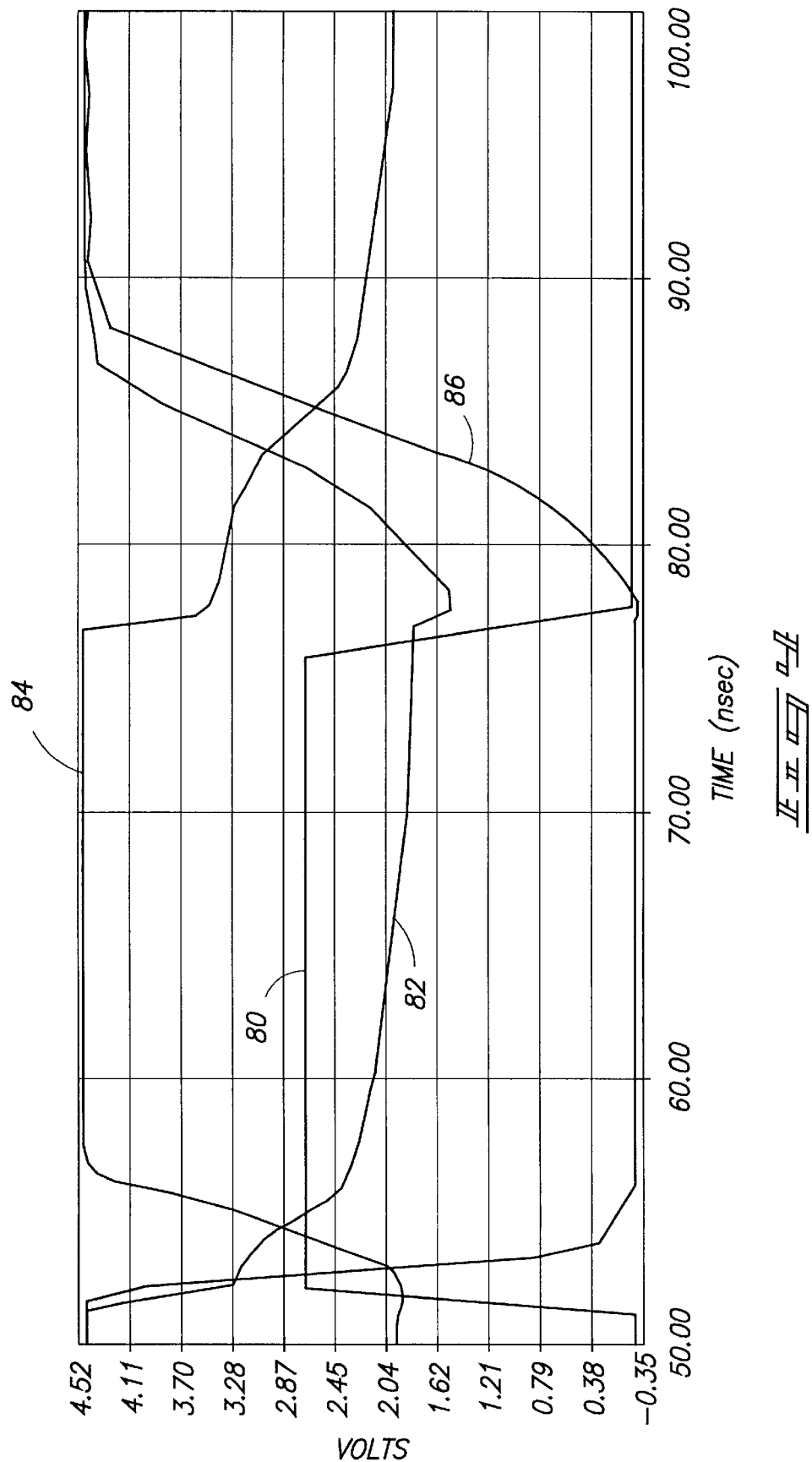

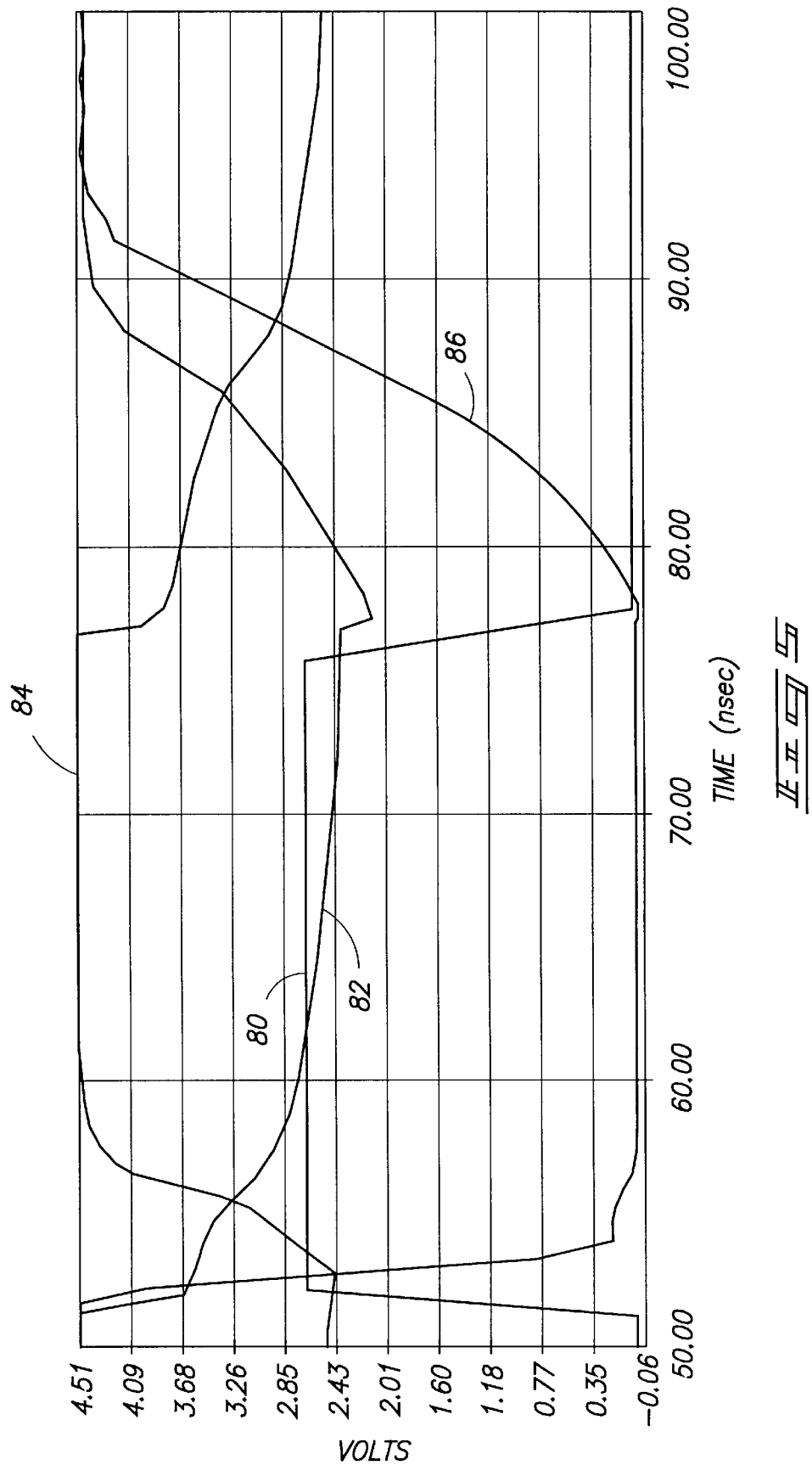

DIGITAL INTEGRATED CIRCUIT BUFFER DIGITAL DEVICE AND METHOD FOR BUFFERING DATA

TECHNICAL FIELD

The present invention relates to digital integrated circuits, buffers, digital devices and methods for buffering data.

BACKGROUND OF THE INVENTION

Recent developments in portable personal computer technology have generated a large demand for low power integrated circuits. Such low power circuits typically have a supply voltage of 3.3 volts with a tolerance of +/−0.3 volts. The utilization of low power integrated circuits within portable systems provides advantages such as reduced consumption and lower battery life. However, selected conventional 5 volt integrated circuits provide performance advantages over low power 3.3 volt integrated circuits. Therefore, it is desirable to utilize both 5 volt integrated circuits and 3.3 volt integrated circuits within a single personal computer system.

However, several problems may arise when 3.3 volt and 5 volt integrated circuits are utilized within a single device. More specifically, 3.3 volt integrated circuits usually have a thin MOS gate oxide compared with 5 volt integrated circuits (e.g., 70 angstroms versus 90 angstroms). The MOS gate oxide of 3.3 volt circuits may become leaky when a 5 volt input signal is applied to it. The MOS gate oxide may become leaky due to tunneling effect or time-dependent dielectric breakdown (TDDB) effect. The gate oxide might also be permanently damaged if the electric field in the oxide is larger than its breakdown voltage.

A mixed voltage buffer may be utilized intermediate mixed voltage logic circuits to provide circuit compatibility. Conventional mixed voltage buffers typically include a PMOS transistor to couple the 5 volt supply with the buffer output. However, leakage current may occur intermediate the 5 volt power supply and the buffer output via a parasitic junction diode of the PMOS transistor. Other reliability issues which may arise with the mixing of 3.3 volt and 5 volt integrated circuits include hot carrier effect and electromigration due to higher voltages.

A cascade output NMOS transistor may be utilized to protect an NMOS output transistor of the input/output buffer to eliminate or minimize many of the aforementioned design problems.

Other conventional designs further include biasing circuits for reducing voltage drops across 3.3 volt components in mixed voltage applications. However, these designs generally continually draw considerable amounts of current. Such designs have significant drawbacks inasmuch as numerous mixed voltage interfacing applications involve portable or otherwise battery powered computers wherein minimal current consumption is desired for maximum usage from the limited power source.

Other designs provide only for the generation of a 3.3 volt output signal. Such designs are incompatible for applications where 5 volt output signals are necessary inasmuch as internal components of the conventional devices are not designed to withstand the increased voltages. Such designs typically lack appropriate circuitry for maintaining voltage drops across internal components within an acceptable design range.

BRIEF DESCRIPTION OF THE DRAWINGS

Preferred embodiments of the invention are described below with reference to the following accompanying drawings.

FIG. 3 is a schematic diagram of a buffer in accordance with an embodiment of the present invention.

FIG. 4 is a simulation of the buffer shown in FIG. 3.

FIG. 5 is a simulation of the buffer shown in FIG. 3 utilizing slow n, fast p transistors.

DETAILED DESCRIPTION OF THE PREFERRED EMBODIMENTS

Figure 1:
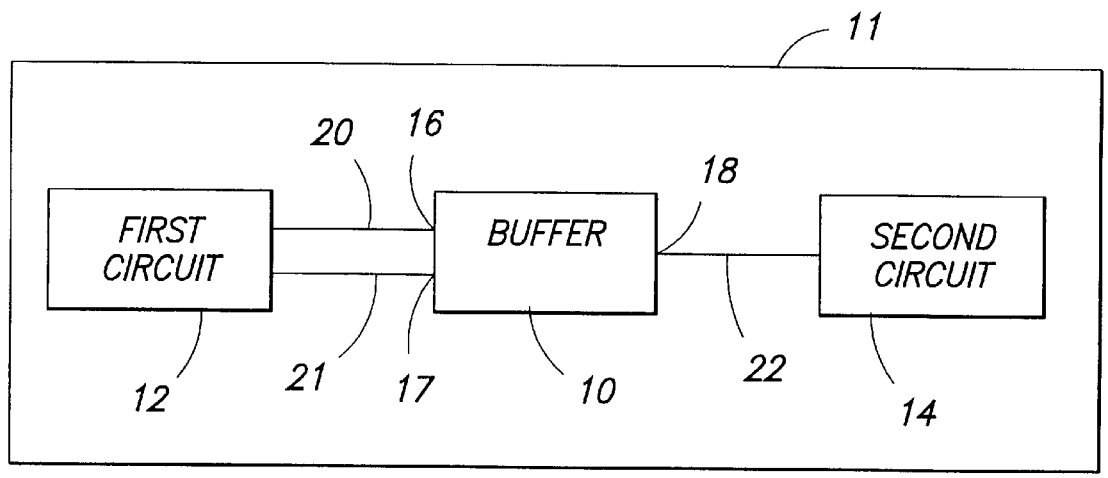
FIG. 1 is a functional block diagram of an electric device having a buffer intermediate a first circuit and second circuit.

This disclosure of the invention is submitted in furtherance of the constitutional purposes of the U.S. Patent Laws "to promote the progress of science and useful arts" (Article 1, Section 8).

In one aspect of the present invention, a digital integrated circuit comprises: a data input configured to receive an input signal at a first voltage; a data output configured to output an output signal at a second voltage; a controller coupled with the data input and the controller being configured to generate an internal control signal and an external control signal responsive to the input signal; the controller having a first voltage regulator configured to maintain the external control signal above a threshold and a feedback voltage regulator configured to maintain the internal control signal above a threshold; and an output driver coupled with the data output and the controller, the output driver being configured to apply the output signal to the data output responsive to the external control signal.

A second aspect of the present invention provides a buffer comprising: a voltage terminal; a data input configured to receive an input signal at a first voltage; a data output configured to output an output signal at a second voltage; an output driver coupled with the data output and the output driver being configured to apply the output signal to the data output, the output driver including a first output transistor and second output transistor intermediate the voltage terminal and the data output; and a controller coupled with the data input and the output driver, the controller configured to apply a first external control signal to the first output transistor and a second external control signal to the second output transistor responsive to the input signal.

Another aspect of the present invention provides a buffer comprising: a voltage terminal; a data input configured to receive an input signal at a first voltage; a data output configured to output an output signal at a second voltage; an output driver coupled with the data output and the output driver being configured to apply the output signal to the data output; the output driver including a first output transistor, a second output transistor, a protection circuit, and a common node connecting the first output transistor and the second output transistor and the protection circuit, the first output transistor and second output transistor being provided intermediate the voltage terminal and the data output and configured to apply the output signal to the data output and the protection circuit being configured to maintain the voltage of the common node above a predetermined threshold; and a controller coupled with the data input and the output driver, the controller configured to apply an external control signal to the output driver to control the application of the output signal.

Another aspect of the present invention provides a digital device comprising: a first circuit configured to generate an input signal at a first voltage; a second circuit configured to receive an output signal at a second voltage; a voltage terminal; a data input configured to receive the input signal; a data output configured to output the output signal; a first output transistor having a gate and a second output transistor having a gate; the first output transistor and the second output transistor being provided intermediate the voltage terminal and the data output, and the first output transistor and the second output transistor being operable to apply the output signal to the data output; a first control transistor configured to apply a first external control signal to the gate of the first output transistor; and a second control transistor configured to apply a second external control signal to the gate of the second output transistor.

An additional aspect of the present invention provides a method of buffering a data signal comprising: receiving an input signal at a first voltage; generating an internal control signal; generating an external control signal responsive to the internal control signal; maintaining the internal control signal and the external control signal above a threshold; and generating an output signal at a second voltage responsive to the generating of the external control signal.

Referring to FIG. 1, an electrical device 11 is shown. Electrical device 11 comprises a digital integrated circuit, also referred to as a buffer 10, intermediate two digital circuits 12, 14. In particular, buffer 10 is provided intermediate a first circuit 12 operating at a first voltage and a second circuit 14 operating at a second voltage different from the first voltage. For example, first circuit 12 is typically a 3.3 volt circuit and second circuit 14 is typically a 5 volt circuit. In one embodiment, electrical device 11 is a digital device, such as a portable computer, often referred to as a laptop or notebook computer. Buffer 10 may be advantageously utilized in any application where it is desired to minimize the power consumption of internal components. Alternately, buffer 10 may be utilized in any mixed voltage applications where an output signal of one voltage is generated responsive to an input signal of a different voltage.

Data lines 20, 22 respectively couple first circuit 12 and second circuit 14 with buffer 10. In addition, a control line 21 couples control circuitry within first circuit 12 with buffer 10. It is understood that control circuitry may be external to first circuit 12 in other configurations.

Buffer 10 preferably includes a data input 16, data output 18 and output enable interface 17. The output of first circuit 12 applied to data input 16 is referred to herein as an input signal. The output of buffer 10 is referred to herein as an output signal. The input signal is applied via data line 20 to data input 16 of buffer 10. Typically, the input signal generated by first circuit 12 is at the first voltage (e.g., 3.3 volts). The output signal of buffer 10 is applied via data output 18 and data line 22 to second circuit 14. The output data signal of buffer 10 is typically at the second voltage (e.g., 5 volts).

An output enable control signal generated by the control circuitry within the first circuit 12 selectively enables the buffer 10. The output enable signal is applied via line 21 to the output enable interface 17. One embodiment of buffer 10 is enabled responsive to receiving a logic low output enable control signal. Alternatively, buffer 10 may be configured for enablement responsive to receiving a logic high output enable control signal.

Figure 2:
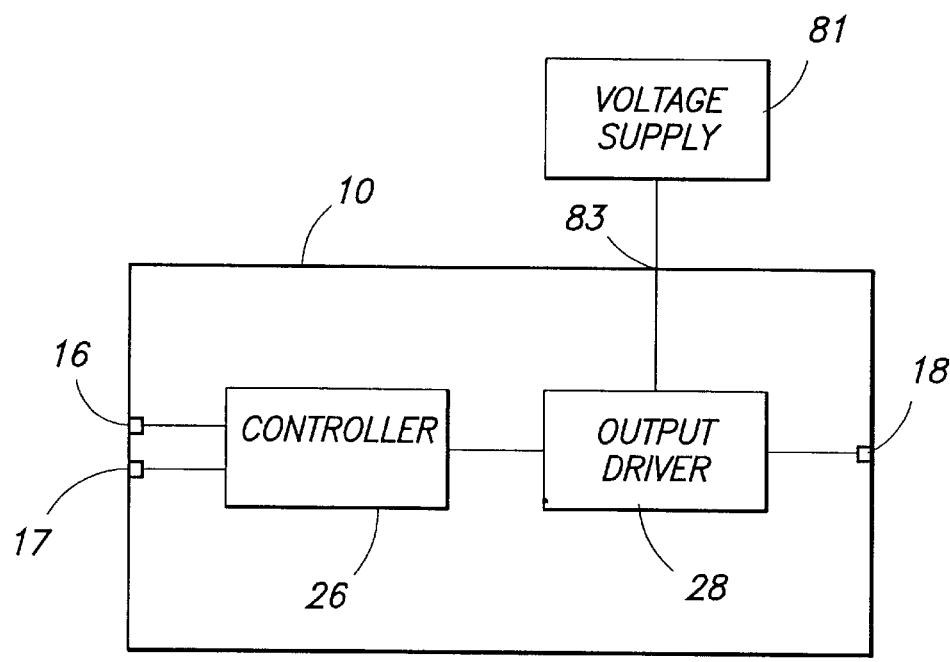
FIG. 2 is a functional block diagram of a buffer in accordance with an embodiment of the present invention.

Referring to FIG. 2, a preferred buffer 10 includes a controller 26 and output driver 28. The input signal and output enable control signal are received at data input 16 and output enable interface 17, respectively. The input signal and output enable control signal are subsequently applied to controller 26. Controller 26 is configured to control output driver 28 and the generation of output signals thereby responsive to input data signals received via data input 16. Output driver 28 includes a voltage input or terminal 83. A voltage supply 81 is coupled with voltage terminal 83 of output driver 28.

Referring to FIG. 3, a preferred embodiment of buffer 10, and the controller 26 and output driver 28 therein, are shown. Buffer 10 is configured to operate at 5 volts and may be implemented in a 3.3 volt +CMOS technology. Voltage supply 81 coupled with voltage terminal 83 is typically a 5 volt source in such an implementation. Buffer 10 is accordingly configured to output a 5 volt signal via output driver 28 responsive to an appropriate input signal. Output driver 28 comprises a plurality of output transistors 30, 32, 34, 36 and a protection circuit 78. The output transistors of output driver 28 are referred to herein as a first output transistor 30, second output transistor 32, third output transistor 34 and fourth output transistor 36. First and second output transistors 30, 32 are typically of a first conductivity type (e.g., PMOS transistors) and third and fourth output transistors 34, 36 are typically of a second conductivity type (e.g., NMOS transistors).

Controller 26 comprises a plurality of PMOS control transistors 50, 52, 54 and a plurality of NMOS control transistors 44, 46, 48, 56. The PMOS transistors are referred to herein as first control transistor 50, second control transistor 52 and feedback transistor 54. Logic control circuitry, including NAND gate 40 and NOR gate 42, are provided within controller 26 to selectively bias appropriate control transistors.

Controller 26 additionally comprises a plurality of voltage regulators 70, 72, 74. The voltage regulators are referred to herein as a feedback voltage regulator 70, first voltage regulator 72, and second voltage regulator 74. Voltage regulators 70, 72, 74 individually comprise a plurality of voltage drop elements. In the illustrated embodiment, voltage regulators 70, 72, 74 respectively comprise three voltage drop elements.

In one embodiment of the present invention the voltage drop elements comprise cascaded NMOS transistors as shown in FIG. 3. The cascaded NMOS transistors within the voltage regulators 70, 72, 74 are configured as diodes. Each voltage regulator 70, 72, 74 comprises three cascaded NMOS transistors in the preferred embodiment of buffer 10.

The gate electrode of first control transistor 50 is coupled with the drain electrode of feedback transistor 54 and voltage regulator 70 at node 60. The gate electrode of output transistor 30 is coupled with the drain electrode of control transistor 50 and voltage regulator 72 at node 62. The gate electrode of output transistor 32 is coupled with the drain electrode of second control transistor 52 and voltage regulator 74 at node 66. Voltage regulators 70, 72, 74 are individually configured to maintain the voltage of corresponding nodes 60, 62, 66 above a threshold.

Controller 26 is operable to generate and apply an internal control signal to node 60 to control the operation of first control transistor 50. Controller 26 is also operable to generate external control signals which are applied to output driver 28. In particular, a first external control signal is applied to node 62 and the gate of first output transistor 30. A second external control signal is applied to node 66 and the gate of second output transistor 32. Controller 26 controls the operation of output driver 28 and the generation of output signals thereby by controlling the applications of external control signals to output driver 28.

First output transistor 30 and second output transistor 32 are cascaded PMOS transistors. The source of output transistor 30 is coupled with a voltage terminal 83. The drain of output transistor 30 is coupled with the source of output transistor 32 at common node 68. The drain of output transistor 32 is coupled with data output 18. Third output transistor 34 and fourth output transistor 36 are cascaded NMOS transistors. The drain of output transistor 34 is coupled with data output 18. The source of output transistor 34 is coupled with the drain of output transistor 36. The source of output transistor 36 is coupled with ground. A 3.3 volt biasing signal is applied to the gate electrode of output transistor 34. The gate of output transistor 36 is coupled with NAND gate 40.

The embodiments of buffer 10 shown in FIG. 3 operates as an inverting mixed voltage buffer. In particular, output driver 28 is configured to apply a 5 volt logic high output signal to data output 18 responsive to the reception of a logic low input signal at data input 16. Similarly, buffer 10 outputs a logic low output signal via data output 18 responsive to the reception of a 3.3 volt logic high input signal at data input 16. It is to be understood that input and output data signals having other voltage magnitudes may be received and outputted by buffer 10. Further, buffer 10 may be configured as a non-inverting mixed voltage buffer.

In the embodiment of the invention shown in FIG. 3, buffer 10 is enabled responsive to the output enable control signal received via interface 17 being logic low. Control transistors 48, 52 are biased ON and control transistors 36, 44, 56 are biased OFF responsive to the output enable control signal being logic high (i.e., buffer 10 not enabled).

3.3 volt CMOS devices are typically designed to withstand voltages of 3.6 volts across the gate oxides thereof. Buffer 10 is designed to prevent voltages in excess of 3.6 volts from occurring across the gate oxides of any CMOS device within buffer 10. In particular, voltage regulators 70, 72, 74 are individually configured to maintain the voltages at nodes 60, 62, 66 above a predetermined threshold. For example, the predetermined threshold is approximately 1.9 volts if the supply voltage of the output driver 28 is 5 volts and the supply voltage of the controller 26 is 3.3 volts. A 5 volt voltage source may output a maximum of 5.5 volts, and therefore, the threshold is calculated to be 1.9 volts or 3.6 volts less than the maximum voltage from voltage source 81. Voltage regulators 70, 72, 74 within controller 36 prevent excessive voltages from occurring across the gate oxides of respective transistors 50, 30, 32.

Excessive voltages across the gate oxides may occur when the output of output driver 28 is 0 volts and the supply voltage received at voltage terminal 83 is 5 volts. The preferred buffer 10 according to the present invention is configured to maintain voltages across the gate oxides of all transistors therein within an acceptable range (i.e., below 3.6 volts).

In particular, output driver 28 utilizes cascaded output transistors for protection from overvoltage conditions. In response to the input signal being logic low, first and second output transistors 30, 32 operate to apply 5 volts to data output 18. Simultaneously, output transistors 34, 36 are OFF thereby insulating the data output 18 from ground. Responsive to the input signal being logic high, first and second transistors 30, 32 insulate the supply voltage source (5 volts) from the data output 18, and third and fourth transistors 34, 36 operate to connect data output 18 to ground.

Second output transistor 32 is utilized to allow the voltage of node 62 to rise to 5 volts to turn first output transistor 30 OFF when the input signal is logic high and data output 18 is logic low. Otherwise, 5 volts would be present across the gate of first output transistor 30 if second output transistor 32 were not utilized. Such a voltage could result in damage to or leakage through first output transistor 30. With second output transistor 32 provided intermediate transistor 30 and data output 18, the gate of first output transistor 30 held at a voltage of 2–3 volts, and providing a supply voltage at voltage terminal 83 of 5 volts, then only 2–3 volts will be applied across the gate of first output transistor 30. In a similar manner, third output transistor 34 protects fourth output transistor 36 in the presence of 5 volts at data output 18 and a logic low signal at the gate of output transistor 36.

A protection circuit 78 is provided intermediate first and second output transistors 30, 32 to prevent node 68 from floating to 0 volts. One embodiment of protection circuit 78 comprises a NMOS transistor 69 intermediate a 3.3 volt source and node 68. The drain of NMOS transistor 69 is coupled with the 3.3 voltage source and the source of the NMOS transistor 69 is coupled with node 68.

It is preferred to limit the swing of the voltage at node 62 to further protect first output transistor 30. The source of first output transistor 30 is coupled with a 5 volt supply at terminal 83. Therefore, it is desirable to maintain the voltage at node 62 above a predetermined threshold, such as 1.9 volts, to prevent the application of excessive voltages across the gate of first output transistor 30. Similarly, first control transistor 50 and feedback transistor 54 are also coupled with a 5 volt source. Therefore, it is also desirable to maintain the voltages at nodes 60, 62 above the predetermined threshold to prevent a breakdown in first control transistor 50 and feedback transistor 54. Inasmuch as 5 volts may be applied to the source of output transistor 32, it is also preferred to maintain the voltage at node 66 above the predetermined threshold. The buffer 10 provides voltage regulators 70, 72, 74 to maintain the voltages at respective nodes 60, 62, 66 above the predetermined threshold.

Still referring to FIG. 3, when the input signal received via data input 16 is logic high, buffer 10 outputs a logic low output signal via data output 18. More specifically, the output of NAND gate 40 is inverted and applied to the fourth output transistor 36. Fourth output transistor 36 is biased ON responsive to the input signal being logic high. NMOS output transistor 34 is also biased ON by the 3.3 volt source. Therefore, data output 18 is coupled with ground and is accordingly logic low.

In addition, control transistor 46 is turned ON responsive to the input signal being logic high. Turning ON control transistor 46 drains a portion of the voltage at node 60 to ground. However, voltage regulator 70 maintains the voltage at node 60 at approximately 1.9 volts Thus, first control transistor 50 is protected from the 5 volt supply voltage coupled with the source of first control transistor 50.

NOR gate 42 outputs a logic low signal responsive to the input signal being logic high. The logic low signal from NOR gate 42 maintains control transistor 44 in an OFF state. Control transistor 50 is turned ON responsive to the voltage at node 60 dropping to 1.9 volts. Node 62 is charged to 5 volts responsive to transistor 50 being biased ON and transistor 44 being OFF. First output transistor 30 is OFF responsive to node 62 being 5 volts.

Furthermore, second control transistor 52 is biased ON and control transistor 56 is OFF when the output of NOR gate 42 is logic low. Node 66 is charged to 3 volts responsive to second control transistor 52 being biased ON and control transistor 56 being OFF. Applying the external control signal, in the form of the 3 volt signal at node 66, to the gate of second output transistor 32 turns transistor 32 OFF. The output signal is approximately 0 volts responsive to the input signal being logic high where output transistors 30, 32 are biased OFF and output transistors 34, 36 are biased ON. The voltages at nodes 60, 62, 66 are maintained above the threshold responsive to the input signal being logic high.

In accordance with inverter operation, buffer 10 outputs a 5 volt logic high signal at data output 18 responsive to the input signal being logic low. In particular, the reception of a logic low input signal at data input 16 turns control transistor 46 OFF. Further, NOR gate 42 outputs a logic high signal which turns control transistor 44 ON responsive to the input signal being logic low. A portion of the voltage at node 62 drains to ground responsive to control transistor 44 being biased ON. However, voltage regulator 72 is configured to maintain the voltage at node 62 above a predetermined threshold (e.g., 1.9 volts).

Feedback transistor 54 is biased ON responsive to node 62 being approximately 1.9 volts. As set forth above, control transistor 46 is OFF when the input signal is logic low. Similarly, control transistor 48 is biased OFF responsive to the output enable being logic low. Therefore, node 60 charges to 5 volts via feedback transistor 54 when the input signal is low. First control transistor 50 is biased OFF responsive to node 60 being 5 volts and node 62 remains at approximately 1.9 volts. First output transistor 30 is biased ON responsive to node 62 being 1.9 volts.

Second output transistor 32 is also biased ON responsive to the input signal being logic high. In particular, the logic high output from NOR gate 42 (responsive to the input signal being logic high) is applied to control transistors 52, 56. Applying a logic high control signal turns second control transistor 52 OFF and biases control transistor 56 ON. Thus, a portion of the voltage at node 66 drains to ground biasing second output transistor 32 in an ON condition. Voltage regulator 74 operates to maintain the voltage at node 66 at approximately 1.9 volts to protect the gate oxide of second output transistor 32.

Accordingly, both PMOS output transistors 30, 32 are biased ON responsive to the input signal being logic low and the voltage terminal 83 is coupled with the data output 18. The control logic is configured such that a logic low signal is applied to fourth output transistor 36 responsive to the reception of a logic low input signal. Transistor 36 is biased OFF when the input signal is low and the data output 18 is isolated from ground. The output signal is 5 volts responsive to the reception of a logic low input signal in accordance with the inverting operation of the preferred embodiment of buffer 10. The voltages at nodes 60, 62, 66 are maintained above the threshold responsive to the input signal being logic low.

Feedback transistor 54 is provided to assure that first control transistor 50 is OFF when node 62 is logic low. Feedback transistor 54 applies 5 volts to node 60 responsive to node 62 being logic low. Providing feedback transistor 54 impedes leakage through first control transistor 50. Similarly, first control transistor 50 operates to pull node 62 to logic high (5 volts) to impede leakage through feedback transistor 54 and first output transistor 30 responsive to node 60 being logic low.

As an alterative to the embodiment shown in FIG. 3, voltage regulators 70, 72, 74 may be configured to include a plurality of conventional diodes for maintaining appropriate voltage levels at respective nodes 60, 62, 66. Conventional diodes may be utilized to enhance the controllability of the actual voltage drop within the voltage regulators 70, 72, 74 compared with the utilization of a plurality of NMOS transistors individually arranged in a diode configuration.

Referring to FIG. 4, a graphical representation of a simulation of the preferred embodiment of buffer 10 is shown. The abscissa represents time in nanoseconds and the ordinate represents voltage in volts. A low supply voltage of approximately 2.7 volts (instead of 3.3 volts) and a high supply voltage (voltage supply 81) of approximately 4.5 volts were used in the simulation shown in FIG. 4.

Shortly after t=50.00 nsec, the input signal, represented by line 80, received via data input 16 changes from logic low (0 volts) to logic high (2.6 volts). The voltage of the internal control signal at node 60, represented by line 82, gradually drops from 4.5 volts to 1.8 volts following the input signal going high. The voltage of the external control signal at node 62, represented by line 84, increased from approximately 1.9 volts to 4.4 volts following the input signal going high. Consistent with inverting operation, the output signal, represented by line 86, decreased from 4.4 volts to 0 volts following the assertion of the input signal from logic low to logic high.

The input signal going high causes the voltage of the internal control signal on node 60 to fall but not to a level below the predetermined threshold (e.g., 3.6 volts below the voltage of voltage supply 81). The voltage at voltage terminal 83 applied by voltage supply 81 was approximately 4.5 volts in the simulation shown in FIG. 4. The voltage of the internal control signal at node 60 fell to 1.5 volts, or only 3.0 volts below the voltage terminal 83 and within the acceptable range.

In addition, the voltage of the external control signal at node 62 remained above 1.6 volts, or only 2.9 volts below the voltage at terminal 83. Therefore, buffer 10 provides protection of first output transistor 30 and first control transistor 50 during changes in the input signal from logic low to logic high and logic high to logic low.

Referring to FIG. 5, a similar simulation was performed utilizing slow n, fast p transistors within buffer 10. The low supply voltage was approximately 2.7 volts and the high supply voltage was approximately 4.5 volts. Following the assertion of the input signal from logic low to logic high and desertion of the input signal from logic high to logic low, the voltage of the internal control signal at node 60 fell to a lowest level of approximately 2.2 volts. This result was above the predetermined threshold (i.e., greater than 4.5 volts–3.6 volts). The voltage of the external control signal at node 62 increased from approximately 2.4 volts to 4.5 volts following the assertion of the input signal and remained above 2.4 volts during the simulation. This result was also above the predetermined threshold (i.e., greater than 4.5 volts −3.6 volts).

Mixed voltage buffers, and 3.3/5 volt buffers in particular, are commonly utilized in applications where power consumption is a concern. For example, it is desirable to minimize power consumption in laptop or notebook computer applications to maximize the use of the computer from one power source (e.g., battery). Such computers tend to use numerous 3.3 volt components to minimize power consumption. Therefore, mixed voltage buffers are typically utilized to interface between 3.3 volt components and 5 volt components within the computer system. Thus, in one embodiment, the device 11 is a computer.

Accordingly, it is desirable to minimize the power consumption of the mixed voltage buffers utilized in the computer. The mixed voltage buffer in accordance with the present invention provides reduced power consumption compared to conventional mixed voltage buffers. In particular, the embodiment of the buffer 10 shown in FIG. 3 does not require biasing currents for first control transistor 50, first output transistor 30 or second output transistor 32. This novel configuration minimizes power consumption while providing complete interfacing between voltage circuits having different operational voltages.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A digital integrated circuit, comprising:
    a data input configured to receive an input signal at a first voltage;
    a data output configured to output an output signal at a second voltage;
    a controller coupled with the data input and the controller being configured to generate an internal control signal responsive to the input signal and to generate an external control signal responsive to the input signal and the internal control signal; the controller having a first voltage regulator configured to maintain a voltage of the external control signal above a threshold and a feedback voltage regulator configured to maintain a voltage of the internal control signal above a threshold; and
    an output driver coupled with the data output and the controller, the output driver being configured to apply the output signal to the data output responsive to the external control signal.

2. The digital integrated circuit according to claim 1 wherein the first voltage is approximately 3.3 volts and the second voltage is approximately 5 volts.

3. The digital integrated circuit according to claim 1 wherein the threshold is approximately 1.9 volts.

4. The digital integrated circuit according to claim 1 wherein the internal control signal is selectively maintained at the second voltage responsive to the external control signal.

5. The digital integrated circuit according to claim 1 wherein the output driver includes a first output transistor and second output transistor intermediate a voltage terminal and the data output and a common node connecting the output transistors.

6. The digital integrated circuit according to claim 5 further comprising a third output transistor and fourth output transistor intermediate the data output and ground.

7. The digital integrated circuit according to claim 5 wherein the output driver includes a protection circuit configured to maintain the voltage at the common node above a threshold.

8. The digital integrated circuit according to claim 5 wherein the controller is configured to generate a first external control signal and a second external control signal responsive to the input signal and apply the first external control signal to the first output transistor and apply the second external control signal to the second output transistor.

9. The digital integrated circuit according to claim 8 wherein the controller further comprises a first control transistor operable to apply the first external control signal and a second control transistor operable to apply the second external control signal.

10. The digital integrated circuit according to claim 9 further comprising a feedback transistor coupled with the feedback voltage regulator and operable to apply the internal control signal to the first control transistor.

11. The digital integrated circuit according to claim 1 wherein the voltage regulators respectively comprise three voltage drop elements.

12. The digital integrated circuit according to claim 11 wherein the voltage drop elements respectively comprise a transistor configured as a diode.

13. A buffer comprising:
    a voltage terminal;
    a data input configured to receive an input signal at a first voltage;
    a data output configured to output an output signal at a second voltage;
    an output driver coupled with the data output and the output driver being configured to apply the output signal to the data output, the output driver including a first output transistor and second output transistor intermediate the voltage terminal and the data output, and a third output transistor and fourth output transistor intermediate the data output and ground, and wherein the first output transistor and the second output transistor are of a first conductivity type and the third output transistor and fourth output transistor are of a second conductivity type; and
    a controller coupled with the data input and the output driver, the controller configured to apply a first external control signal to the first output transistor and a second external control signal to the second output transistor responsive to the input signal, the controller including a first voltage regulator configured to maintain a voltage of a first external signal above a threshold and a second voltage regulator configured to maintain a voltage of the second external control signal above a threshold.

14. The buffer according to claim 13 wherein the controller comprises a first control transistor operable to apply the first external control signal and a second control transistor operable to apply the second external control signal.

15. The buffer according to claim 14 wherein the controller further comprises a feedback transistor operable to apply an internal control signal to the first control transistor.

16. The buffer according to claim 15 wherein the first external control signal controls the feedback transistor and the first output transistor, and the first external control signal having a preselected voltage.

17. The buffer according to claim 15 further comprising a feedback voltage regulator operable to maintain a voltage of the internal control signal above a threshold.

18. The buffer according to claim 17 wherein the voltage regulators respectively comprise three voltage drop elements.

19. The buffer according to claim 18 wherein the voltage drop elements respective comprise a transistor configured as a diode.

20. The buffer according to claim 13 wherein the external control signals selectively change state between logic high and logic low.

21. The buffer according to claim 20 wherein logic low is greater than approximately 1.9 volts and logic high is approximately 5 volts.

22. A buffer, comprising:
   a voltage terminal;
   a data input configured to receive an input signal at a first voltage;
   a data output configured to output an output signal at a second voltage;
   an output driver coupled with the data output and the output driver being configured to apply the output signal to the data output; the output driver including a first output transistor, a second output transistor, a protection circuit, and a common node connecting the first output transistor and the second output transistor and the protection circuit, the first output transistor and second output transistor being provided intermediate the voltage terminal and the data output and configured to apply the output signal to the data output and the protection circuit being configured to maintain the voltage of the common node above a predetermined threshold; and
   a controller coupled with the data input and the output driver, the controller configured to apply an external control signal to the output driver to control the application of the output signal.

23. The buffer according to claim 22 wherein the protection circuit is coupled to a voltage source.

24. The buffer according to claim 22 wherein the output driver further comprises a third output transistor and a fourth output transistor intermediate the data output and ground.

25. The buffer according to claim 22 wherein the controller further comprises a first control transistor operable to apply a first external control signal to the first output transistor, a second control transistor operable to apply a second external control signal to the second output transistor and a feedback transistor operable to apply an internal control signal to the first control transistor.

26. The buffer according to claim 25 further comprising a first voltage regulator operable to maintain the voltage of the first external control signal above a threshold, a second voltage regulator operable to maintain the voltage of the second external control signal above a threshold and a feedback voltage regulator operable to maintain the voltage of the internal control signal above a threshold.

27. A digital device, comprising:
   a first circuit configured to generate an input signal at a first voltage;
   a second circuit configured to receive an output signal at a second voltage;
   a voltage terminal;
   a data input configured to receive the input signal;
   a data output configured to output the output signal;
   a first output transistor having a gate and a second output transistor having a gate; the first output transistor and the second output transistor being provided intermediate the voltage terminal and the data output, and the first output transistor and the second output transistor being operable to apply the output signal to the data output;
   a first control transistor configured to apply a first external control signal to the gate of the first output transistor;
   a second control transistor configured to apply a second external control signal to the gate of the second output transistor;
   a first voltage regulator configured to maintain a voltage of the first external control signal above a threshold; and
   a second voltage regulator configured to maintain a voltage of the second external control signal above a threshold.

28. The digital device according to claim 27 wherein the digital device comprises a computer.

29. The digital device according to claim 27 wherein the first control transistor includes a gate and further comprising a feedback transistor configured to apply an internal control signal to the gate of the first control transistor.

30. The digital device according to claim 29 further comprising a feedback voltage regulator operable to maintain the voltage of the internal control signal above a threshold.

31. The digital device according to claim 27 wherein the external control signals selectively change state between logic high and logic low.

32. The digital device according to claim 31 wherein logic low is greater than approximately 1.9 volts and logic high is approximately 5 volts.

33. The digital device according to claim 27 wherein the output driver further comprises a third output transistor and fourth output transistor intermediate the data output and ground.

34. The digital device according to claim 33 wherein the first output transistor and the second output transistor are of a first conductivity type and the third output transistor and fourth output transistor are of a second conductivity type.

35. In a mixed voltage buffer comprising a date input configured to receive an input signal, a data output configured to output an output signal, an output driver having a first output transistor and a second output transistor operable to apply the output signal to the data output, and a controller configured to control the application of the output signal responsive to the input signal, the controller comprises:
   a first control transistor having a gate and the first control transistor being configured to apply a first external control signal to the first output transistor;
   a second control transistor configured to apply a second external control signal to the second output transistor;
   a feedback transistor configured to apply an internal control signal to the gate of the first control transistor responsive to the first external control signal; and
   a first voltage regulator, a second voltage regulator and a feedback voltage regulator respectively operable to maintain the voltages of the first external control signal, second external control signal and internal control signal above a threshold.

36. The controller according to claim 35 wherein the voltage regulators respectively comprise three voltage drop elements.

37. The controller according to claim 36 wherein the voltage drop elements respectively comprise a transistor configured as a diode.

38. The controller according to claim 35 wherein the external control signals selectively change state between logic high and logic low.

39. The controller according to claim 38 wherein logic low is greater than approximately 1.9 volts and logic high is approximately 5 volts.

40. The controller according to claim 35 wherein the internal control signal is operable to selectively maintain the first control transistor in an OFF state and prevent current leakage therethrough.

41. The controller according to claim 35 wherein the first external control signal is operable to selectively maintain the first output transistor and the feedback transistor in an OFF state to prevent current leakage through the first output transistor and the feedback transistor.

42. A mixed voltage buffer, comprising:

a voltage terminal;

a data input configured to receive an input signal having an approximately voltage of 3.3 volts a data output configured to output an output signal having an approximately voltage of 5 volts;

an output driver coupled with the data output, the output driver having a first output transistor including a gate, a second output transistor including a gate, a protection circuit, and a common node connecting the first output transistor and the second output transistor and the protection circuit, the first output transistor and the second output transistor being provided intermediate the voltage terminal and the data output and configured to selectively apply the output signal to the data output, and the protection circuit being configured to maintain the voltage of the common node above a threshold; and a controller coupled with the data input and the output driver, the controller having a first control transistor including a gate, a second control transistor, a feedback transistor having a gate, a first voltage regulator, a second voltage regulator and a feedback voltage regulator; the first control transistor being configured to apply a first external control signal to the gate of the first output transistor and the gate of the feedback transistor responsive to the input signal, the second control transistor being configured to apply a second external control signal to the gate of the second output transistor responsive to the input signal, the feedback transistor being configured to apply an internal control signal to the gate of the first control transistor responsive to the input signal, the feedback voltage regulator being configured to maintain the voltage of the internal control signal above a threshold, the first voltage regulator being configured maintain the voltage of the first external control signal above a threshold and the second voltage regulator being configured maintain the voltage of the second external control signal above a threshold.

43. A method of buffering a data signal comprising:

receiving an input signal at a first voltage;

generating an internal control signal;

generating a first external control signal responsive to the internal control signal;

generating a second external control signal;

maintaining the internal control signal above a voltage threshold and the first external control signal above a voltage threshold; and generating an output signal at a second voltage responsive to the generating of the first external control signal; and wherein the internal control signal is controlled responsive to the first external control signal.

44. The method according to claim 43 further comprising the steps of applying the first external control to a first output transistor and applying the second external control signal to a second output transistor.

45. The method according to claim 43 wherein the first external control signal and second external control signal selectively change state between logic high and logic low.

46. The method according to claim 44 wherein the first transistor and second transistor are operable to generate the output signal responsive to the first external control signal and the second external control signal.

47. The method according to claim 46 further comprising a common node connecting the first output transistor and the second output transistor.

48. The method according to claim 47 further comprising maintaining the voltage at the common node above a threshold.

49. The method according to claim 43 wherein the first voltage is approximately 3.3 volts and the second voltage is approximately 5 volts.

50. The method according to claim 49 wherein the threshold is approximately 1.9 volts.

51. The digital integrated circuit according to claim 1 wherein the output driver comprises an output transistor configured to apply the output signal to the data output and the controller comprises a control transistor configured to apply the external control signal to the output transistor to control the output transistor.

52. The digital integrated circuit according to claim 51 wherein the controller comprises a feedback transistor coupled with the feedback voltage regulator and configured to apply the internal control signal to the control transistor to control the control transistor.

53. The method according to claim 43 wherein the generating the output signal comprises generating using an output transistor and the generating the external control signal comprises generating using a control transistor.

54. The method according to claim 43 further comprising:

applying the external control signal to a feedback transistor; and controlling the generating of the internal control signal using the feedback transistor responsive to the external control signal.

55. A digital integrated circuit, comprising:

a data input configured to receive an input signal at a first voltage;

a data output configured to output an output signal at a second voltage;

a controller coupled with the data input and the controller being configured to generate an internal control signal and an external control signal responsive to the input signal; the controller having a first voltage regulator configured to maintain the external control signal above a threshold of approximately 1.9 volts and a feedback voltage regulator configured to maintain the internal control signal above a threshold of approximately 1.9 volts; and an output driver coupled with the data output and the controller, the output driver being configured to apply the output signal to the data output responsive to the external control signal.

56. A buffer comprising:

a voltage terminal;

a data input configured to receive an input signal at a first voltage;

a data output configured to output an output signal at a second voltage;

an output driver coupled with the data output and the output driver being configured to apply the output signal to the data output, the output driver including a first output transistor and second output transistor intermediate the voltage terminal and the data output; and a controller coupled with the data input and the output driver, the controller including a first control transistor configured to apply a first external control signal to the first output transistor, a second control transistor configured to apply a second external control signal to the second output transistor responsive to the input signal, a feedback transistor operable to apply an internal control signal to the first control transistor, wherein the first external control signal controls the feedback transistor and the first output transistor, and the first external control signal has a preselected voltage.

57. A buffer comprising:

a voltage terminal;

a data input configured to receive an input signal at a first voltage;

a data output configured to output an output signal at a second voltage;

an output driver coupled with the data output and the output driver being configured to apply the output signal to the data output, the output driver including a first output transistor and second output transistor intermediate the voltage terminal and the data output; and a controller coupled with the data input and the output driver, the controller including a first control transistor configured to apply a first external control signal to the first output transistor, a second control transistor configured to apply a second external control signal to the second output transistor responsive to the input signal, and a feedback transistor operable to apply an internal control signal to the first control transistor, a first voltage regulator, second voltage regulator and feedback voltage regulator configured to maintain the voltages of the first external control signal, second external control signal and internal control signal above a threshold.

58. The buffer according to claim 57 wherein the voltage regulators respectively comprise three voltage drop elements.

59. The buffer according to claim 58 wherein the voltage drop elements respectively comprise a transistor configured as a diode.

60. A buffer comprising:

a voltage terminal;

a data input configured to receive an input signal at a first voltage;

a data output configured to output an output signal at a second voltage;

an output driver coupled with the data output and the output driver being configured to apply the output signal to the data output, the output driver including a first output transistor and second output transistor intermediate the voltage terminal and the data output; and a controller coupled with the data input and the output driver, the controller configured to apply a first external control signal to the first output transistor and a second external control signal to the second output transistor responsive to the input signal, wherein the external control signals selectively change state between logic high and logic low and logic low is greater than approximately 1.9 volts and logic high is approximately 5 volts.

61. A digital device comprising:

a first circuit configured to generate an input signal at a first voltage;

a second circuit configured to receive an output signal at a second voltage;

a voltage terminal;

a data input configured to receive the input signal;

a data output configured to output the output signal;

a first output transistor having a gate and a second output transistor having a gate; the first output transistor and the second output transistor being provided intermediate the voltage terminal and the data output, and the first output transistor and the second output transistor being operable to apply the output signal to the data output;

a first control transistor including a gate and configured to apply a first external control signal to the gate of the first output transistor;

a second control transistor configured to apply a second external control signal to the gate of the second output transistor;

a feedback transistor configured to apply an internal control signal to the gate of the first control transistor; and a first voltage regulator operable to maintain the voltage of the first external control signal above a threshold, a second voltage regulator operable to maintain the voltage of the second external control signal above a threshold and a feedback voltage regulator operable to maintain the voltage of the internal control signal above a threshold.

62. A digital device, comprising:

a first circuit configured to generate an input signal at a first voltage;

a second circuit configured to receive an output signal at a second voltage;

a voltage terminal;

a data input configured to receive the input signal;

a data output configured to output the output signal;

a first output transistor having a gate and a second output transistor having a gate; the first output transistor and the second output transistor being provided intermediate the voltage terminal and the data output, and the first output transistor and the second output transistor being operable to apply the output signal to the data output;

a first control transistor configured to apply a first external control signal to the gate of the first output transistor; and a second control transistor configured to apply a second external control signal to the gate of the second output transistor, wherein the external control signals selectively change state between logic high and logic low, and logic low is greater than approximately 1.9 volts and logic high is approximately 5 volts.

63. In a mixed voltage buffer comprising a data input configured to receive an input signal, a data output configured to output an output signal, an output driver having a first output transistor and a second output transistor operable to apply the output signal to the data output, and a controller configured to control the application of the output signal responsive to the input signal, the controller comprises:

a first control transistor having a gate and the first control transistor being configured to apply a first external control signal to the first output transistor;

a second control transistor configured to apply a second external control signal to the second output transistor;

a feedback transistor configured to apply an internal control signal to the gate of the first control transistor responsive to the input signal; and a first voltage regulator, second voltage regulator and feedback voltage regulator operable to maintain the voltages of the respective first external control signal, second external control signal and internal control signal above a threshold.

64. The controller according to claim 63 wherein the voltage regulators respectively comprise three voltage drop elements.

65. The controller according to claim 64 wherein the voltage drop elements respectively comprise a transistor configured as a diode.

66. In a mixed voltage buffer comprising a data input configured to receive an input signal, a data output configured to output an output signal, an output driver having a first output transistor and a second output transistor operable to apply the output signal to the data output, and a controller configured to control the application of the output signal responsive to the input signal, the controller comprises:

a first control transistor having a gate and the first control transistor being configured to apply a first external control signal to the first output transistor;

a second control transistor configured to apply a second external control signal to the second output transistor; and a feedback transistor configured to apply an internal control signal to the gate of the first control transistor responsive to the input signal, wherein the first and second external control signals selectively change state between logic high and logic low and logic low is greater than approximately 1.9 volts and logic high is approximately 5 volts.

67. In a mixed voltage buffer comprising a data input configured to receive an input signal, a data output configured to output an output signal, an output driver having a first output transistor and a second output transistor operable to apply the output signal to the data output, and a controller configured to control the application of the output signal responsive to the input signal, the controller comprises:

a first control transistor having a gate and the first control transistor being configured to apply a first external control signal to the first output transistor;

a second control transistor configured to apply a second external control signal to the second output transistor; and a feedback transistor configured to apply an internal control signal to the gate of the first control transistor responsive to the input signal, wherein the internal control signal is operable to selectively maintain the first control transistor in an OFF state and prevent current leakage therethrough.

68. In a mixed voltage buffer comprising a data input configured to receive an input signal, a data output configured to output an output signal, an output driver having a first output transistor and a second output transistor operable to apply the output signal to the data output, and a controller configured to control the application of the output signal responsive to the input signal, the controller comprises:

a first control transistor having a gate and the first control transistor being configured to apply a first external control signal to the first output transistor;

a second control transistor configured to apply a second external control signal to the second output transistor; and a feedback transistor configured to apply an internal control signal to the gate of the first control transistor responsive to the input signal, wherein the first external control signal is applied to the feedback transistor, the first external control signal being operable to selectively maintain the first output transistor and the feedback transistor in an OFF state and prevent current leakage through the first output transistor and the feedback transistor.

69. A method of buffering a data signal, comprising:

receiving an input signal at a first voltage;

generating an internal control signal;

generating a first external control signal an da second external control signal responsive to the internal control signal;

maintaining the internal control signal and the first and second external control signals above a threshold; and generating an output signal at a second voltage responsive to the generating of the first and second external control signals, wherein the internal control signal is controlled responsive to the first external control signal.

70. A method of buffering a data signal, comprising:

receiving an input signal at a first voltage of approximately 3.3 volts;

generating an internal control signal;

generating an external control signal responsive to the internal control signal;

maintaining the internal control signal and the external control signal above a threshold of approximately 1.9 volts; and generating an output signal at a second voltage of approximately 5 volts responsive to the generating of the external control signal.

* * * * *

UNITED STATES PATENT AND TRADEMARK OFFICE
CERTIFICATE OF CORRECTION

PATENT NO. : 6,066,962
DATED : May 23, 2000
INVENTOR(S) : James D. Shiffer II, et al.

It is certified that error appears in the above-identified patent and that said Letters Patent is hereby corrected as shown below:

Col. 1, line 15
 replace "lower"
 with --longer--.
Col. 2, line 1
 replace "electric"
 with --electrical--.
Col. 8, line 11
 replace "after t=50"
 with --after time t=50--.
Col. 8, line 31
 replace "voltage"
 with --voltage at--.
Col. 10, line 60
 replace "respective"
 with --respectively--.
Col. 13, line 4
 replace "approximately"
 with --approximate--.
Col. 13, line 6
 replace "approximately"
 with --approximate--.
Col. 15, line 4
 replace "has"
 with --having--.

UNITED STATES PATENT AND TRADEMARK OFFICE
CERTIFICATE OF CORRECTION

PATENT NO. : 6,066,962
DATED : May 23, 2000
INVENTOR(S) : James D. Shiffer II, et al.

It is certified that error appears in the above-identified patent and that said Letters Patent is hereby corrected as shown below:

Col. 18, line 25
  replace "an da"
  with --and a--.

Signed and Sealed this

First Day of May, 2001

Attest:

NICHOLAS P. GODICI

Attesting Officer        Acting Director of the United States Patent and Trademark Office